(12) United States Patent
Frankel

(10) Patent No.: US 8,403,315 B2
(45) Date of Patent: Mar. 26, 2013

(54) FILM TRANSFER FRAME

(75) Inventor: Jonathan Stuart Frankel, San Jose, CA (US)

(73) Assignee: Alta Devices, Inc., Santa Clara, CA (US)

( * ) Notice: Subject to any disclaimer, the term of this patent is extended or adjusted under 35 U.S.C. 154(b) by 218 days.

(21) Appl. No.: 13/077,353

(22) Filed: Mar. 31, 2011

(65) Prior Publication Data
US 2012/0251274 A1   Oct. 4, 2012

(51) Int. Cl.
*B65H 9/08* (2006.01)
*B25B 11/00* (2006.01)

(52) U.S. Cl. .................. 269/289 R; 269/54.1; 269/54.4; 269/54.5; 414/222.01; 414/226.04; 294/65; 294/185

(58) Field of Classification Search .................. 269/54.1, 269/54.4, 54.5, 289 R; 414/222.01, 226.04; 294/65, 185
See application file for complete search history.

(56) References Cited

U.S. PATENT DOCUMENTS

| | | | |
|---|---|---|---|
| 6,321,739 B1* | 11/2001 | Roberts | 125/35 |
| 7,434,856 B2* | 10/2008 | Gerhard et al. | 294/188 |
| 7,678,667 B2* | 3/2010 | Foote et al. | 438/455 |
| 8,314,008 B2* | 11/2012 | Foote et al. | 438/455 |
| 2005/0012229 A1* | 1/2005 | Herrmann et al. | 257/797 |
| 2011/0063854 A1* | 3/2011 | Johnston et al. | 362/311.03 |
| 2012/0137601 A1* | 6/2012 | Peelman et al. | 52/173.3 |
| 2012/0257952 A1* | 10/2012 | Palm et al. | 414/752.1 |

* cited by examiner

*Primary Examiner* — Evan Pert

(57) ABSTRACT

A system for retaining a film on a single-piece frame includes a frame having a shape with a center open area larger than the film, the frame comprising a plurality of fingers on the frame extending into the open area, and a barb positioned on an end of each of the plurality of fingers, wherein the barbs retain the film. The system also includes an end effecter comprising a first and second plurality of vacuum line openings, wherein the end effecter holds onto the film with the first plurality of vacuum line openings and holds onto the frame with the second plurality of vacuum line openings, wherein the end effecter picks up the film with the first plurality of vacuum line openings and presses the film onto the frame, wherein pressing the film onto the frame will retain the film on the barbs.

24 Claims, 8 Drawing Sheets

FILM TRANSFER FRAME

TECHNICAL FIELD

The present disclosure relates generally to the field of semiconductor device manufacturing processes and more specifically to the field of semiconductor device transportation frames.

BACKGROUND

As illustrated in FIG. 1A, the manufacturing process for solar cells involves the sequential deposition of a plurality of layers onto a substrate. In one embodiment, as illustrated in FIG. 1A, the plurality of layers comprise a sacrificial layer, epitaxial layers, metal layers, and a polyester (PET) film layer. As illustrated in FIG. 1B, when the sacrificial layer is etched away, the remaining layers (e.g., the epitaxial layers, metal layers and PET film layer) are then ready for further processing, such as cleaning and other process steps. The resulting small singulated sheets of thin plastic with layers of polyester (PET) film and gallium arsenide layers are too fragile to be transported through standard process tools. The film lacks the mass and dimensional stability for conveyance systems; it will readily float in a chemical bath; and it cannot withstand impinging streams of either gas or fluid. However, a frame gives the film adequate size and dimensional stability to be handled by automated equipment and retains the film in any orientation in the environment by the process equipment.

In the past, such films have been loaded for processing with the use of a frame 202 with a 2-piece clip 204, such as illustrated in FIG. 2. In the past, one used a two piece assembly with clips 204 on each opposite edge. This requires a manual process to load a PET film assembly into the two-piece assembly. This process is labor intensive and limits the speed by which solar cells can be made. It is not suitable for automation. Other embodiments have also used holes in the PET film that were then lined up to attachments on a frame. This also results in a laborious manual process that is very time consuming and also not suitable for automation.

SUMMARY OF THE INVENTION

This present invention provides a solution to the challenges inherent in processing singulated films such as PET films with a layer of gallium arsenide on it. In a system according to one embodiment of the present disclosure, a system for retaining a film on a single-piece frame is disclosed. The system includes a frame having a shape with a center open area larger than the film, the frame comprising a plurality of fingers on the frame extending into the open area, and a barb positioned on an end of each of the plurality of fingers, wherein the barbs retain the film. The system also includes an end effecter comprising a first and second plurality of vacuum line openings, wherein the end effecter holds onto the film with the first plurality of vacuum line openings and holds onto the frame with the second plurality of vacuum line openings, wherein the end effecter picks up the film with the first plurality of vacuum line openings and presses the film onto the frame, wherein pressing the film onto the frame will retain the film on the barbs. In a method according to one embodiment of the present invention, a method for retaining a film on a single-piece frame is disclosed. The method for retaining a film on a single-piece frame begins by picking up the film with an end-effecter, wherein the end-effecter picks up the film with a first plurality of vacuum line openings. Next, the end-effecter moves the film with the end-effecter to a single-piece frame and presses the film onto the frame to retain the film, wherein the frame comprises a shape with a center open area larger than the film, the frame comprising: a plurality of fingers on the frame extending into the open area; and a barb positioned on an end of each of the plurality of fingers, wherein the barbs retain the film by piercing the film.

A system for retaining a film on a single-piece frame includes a frame having a shape with a center open area larger than the film, the frame comprising a plurality of fingers on the frame extending into the open area, and a barb positioned on an end of each of the plurality of fingers, wherein the barbs retain the film. The system also includes an end effecter comprising a first and second plurality of vacuum line openings, wherein the end effecter holds onto the film with the first plurality of vacuum line openings and holds onto the frame with the second plurality of vacuum line openings, wherein the end effecter picks up the film with the first plurality of vacuum line openings and presses the film onto the frame, wherein pressing the film onto the frame will retain the film on the barbs.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1A:
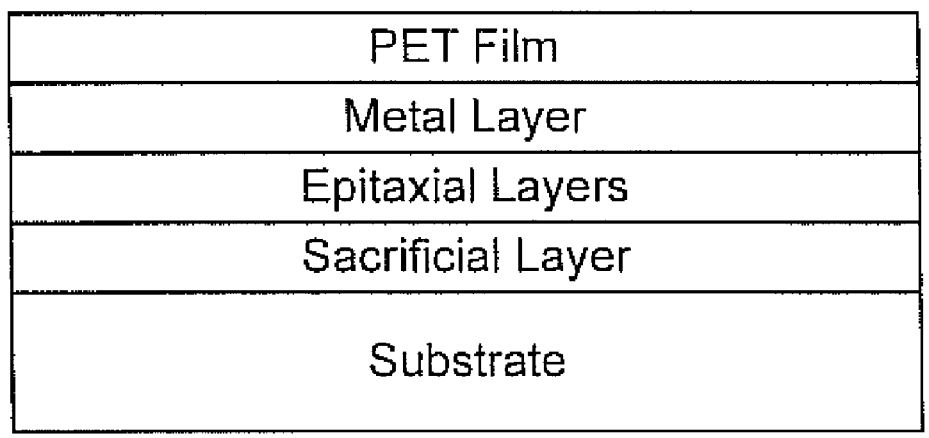
FIG. 1A illustrates a schematic cross-section of a semiconductor device in accordance with an embodiment of the present disclosure.
Figure 1B:
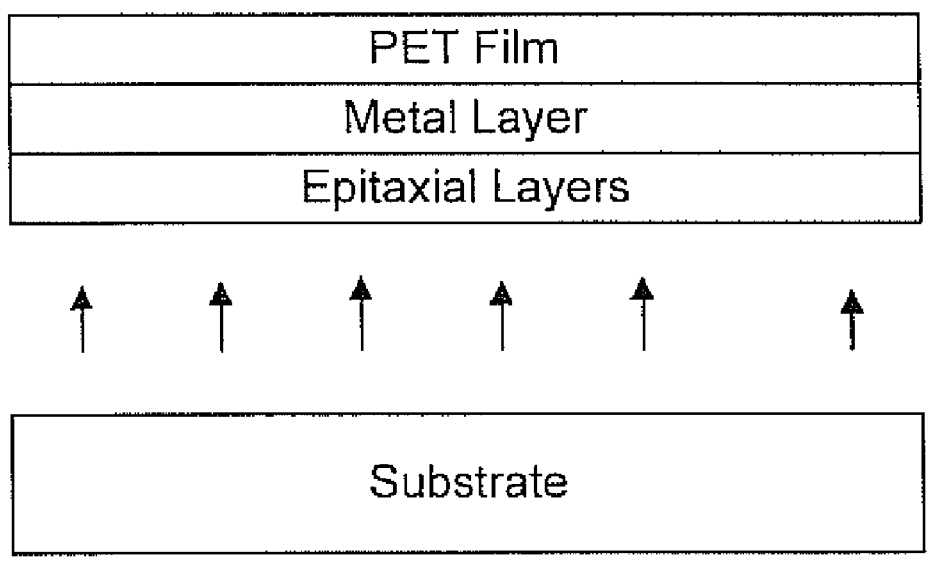
FIG. 1B illustrates a schematic cross-section of a semiconductor device in accordance with an embodiment of the present disclosure.
Figure 2:
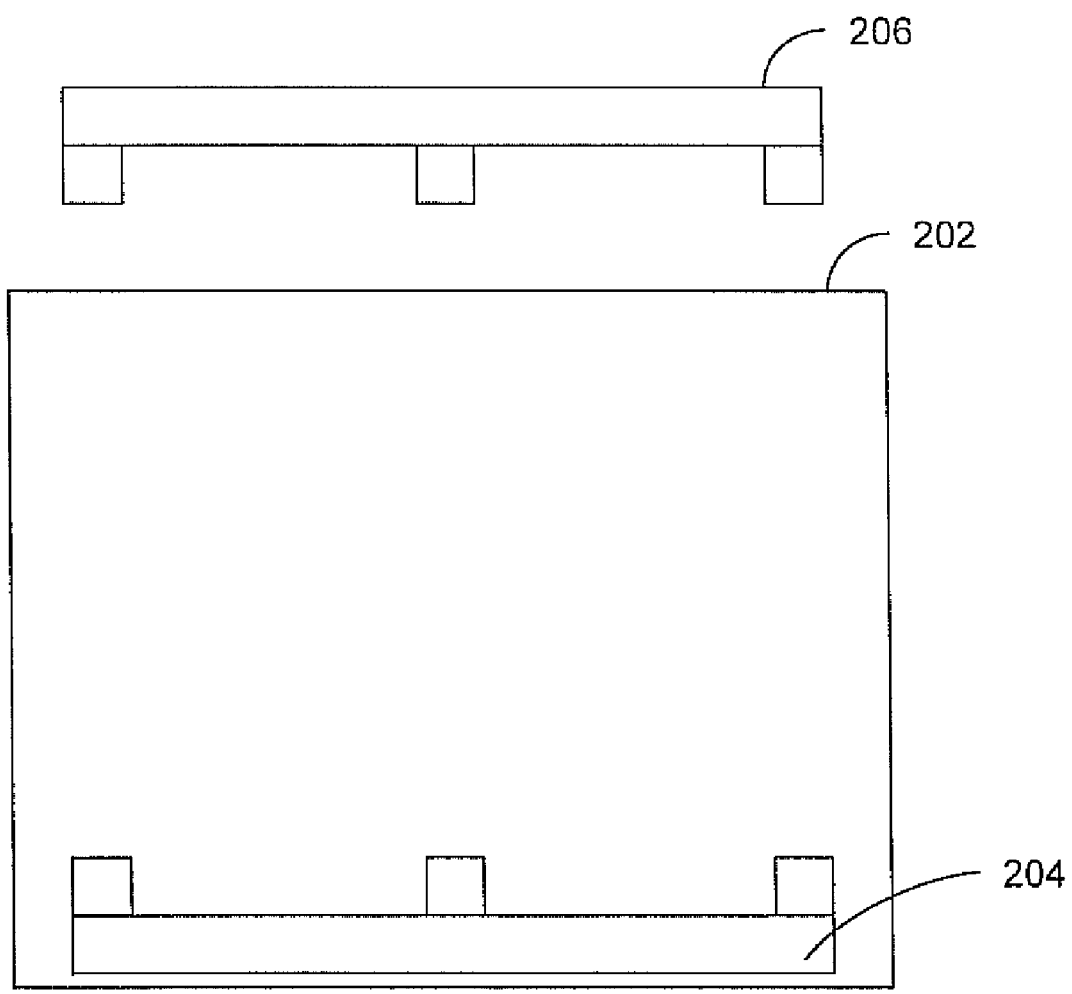
FIG. 2 illustrates a top-down view of a singular film prior art holding frame with clips.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in processing singulated films such as PET films with layers of solar material, such as gallium arsenide. Various embodiments of the present disclosure provide a single piece frame that retains the film during wet cleaning and baking, wherein the frame provides a plurality of barbs for retaining the film to the frame.

In wet processes on singulated films there is a need for a single piece frame that robustly retains film in wet cleaning tools, bake ovens in horizontal and vertical orientations, retains compatibility of the frame with air-knife style drying without a need for secondary drying operations. Further the frame needs to retain a low profile for operation in standard wet cleaning bathes. Lastly, the frame needs to allow rapid, automated loading of film without a need for close alignment or pre-cut features, and with a self-regulating process. Such needs may be met with a frame comprising a plurality of micro-barbs on barb support arms that retain the film without requiring a second piece to secure the film or without requiring the presence of pre-existing features in the film. The micro-barbs create the retaining feature in the film and hold the films. The micro-barbs can hold the film in any orientation, and are easily loaded with a single dimensional robotic motion while secured horizontally, in a one process orientation. The size and shape of the micro-barb and the micro-barb support arms minimize contact for better drying while also allowing for passage through slits into wet baths.

Figure 3:
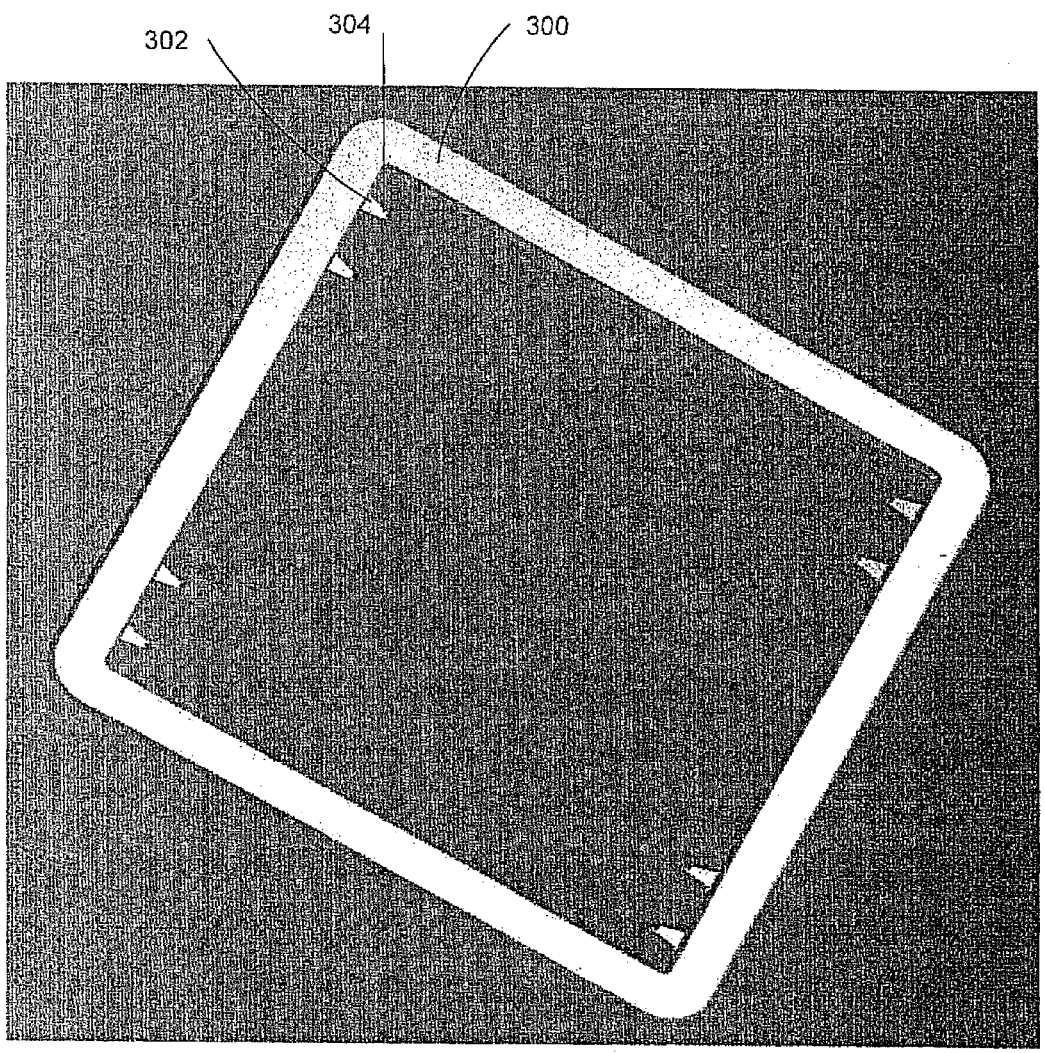
FIG. 3 illustrates a top-down view of a singular film holding frame with a plurality of micro-barbs for holding the film in accordance with an embodiment of the present disclosure.
Figure 5:
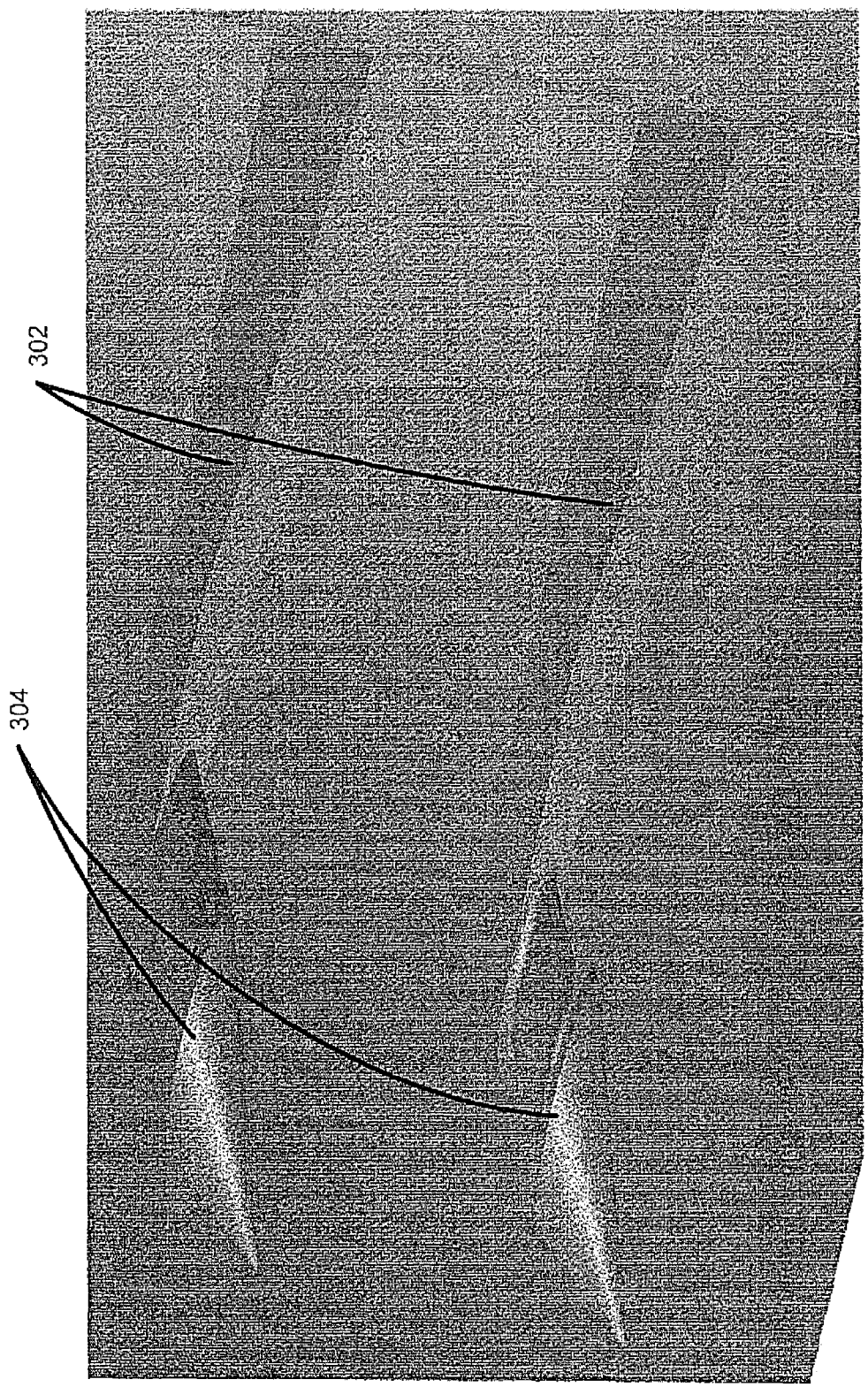
FIG. 5 illustrates a close-up view of the micro-barbs of the holding frame of FIG. 3 in accordance with an embodiment of the present disclosure.

As illustrated in FIG. 3, an exemplary frame 300 has a rectangular shape with a center open area larger than a polyester (PET) film. Extending into the open area are short fingers 302 with a micro-barb at the end 304. The frame 300 is made from a chemically compatible, high temperature polymer. Exemplary embodiments include frames 300 composed of polyether ether ketone (PEEK) or polyvinylidene fluoride (PVDF). Embodiments utilizing a frame 300 formed of PEEK can tolerate exposure to temperatures of over 150 degrees Centigrade, but are more sensitive to long term HF exposure, while embodiments utilizing a frame 300 formed of PVDF are suitable for a more limited maximum temperature range of 140-150 degrees Centigrade, but are also compatible with all process/cleaning chemicals. A film (not shown in FIG. 3) is pressed into the frame by a robotic end-effecter 600, illustrated in FIG. 6. Vacuum holds the film (not shown) to the underside of the end effecter 600. At each barb location on the bottom of the end effecter 600 is a circular cavity 606. As the end-effecter 600 is pushed down against the frame 300, the film deflects into the circular cavity 606 until it fails and the barbs 304 push through it. The end effecter 600 pushes the film into the undercut of the barbs 304, retaining the film. The undercut of the barb 304 is illustrated in FIG. 5. In one embodiment, the frame 300 comprises one microbarb 304 in each corner. In a further embodiment, two barbs 304 are provided in each corner for redundancy, two barbs 304 in each corner of the frame 300 provides a spare in the event that one barb 304 breaks. The height of the micro-barbs 304 must be short enough that the total frame 300 height is less than 3.5 mm in height. In one embodiment, the maximum total frame 300 height may be limited by slot opening dimensions of cleaner baths. Frames 300 of less than 3.5 mm can also be more easily stacked for a selective compliant (assembly or articulated) robot arm (SCARA-type robot). Further, smaller micro-barbs 304, are preferred, while larger barbs 304 may damage the film. Frame 300 heights of no more than 3.5 mm also aid in stacking them.

Figure 4:
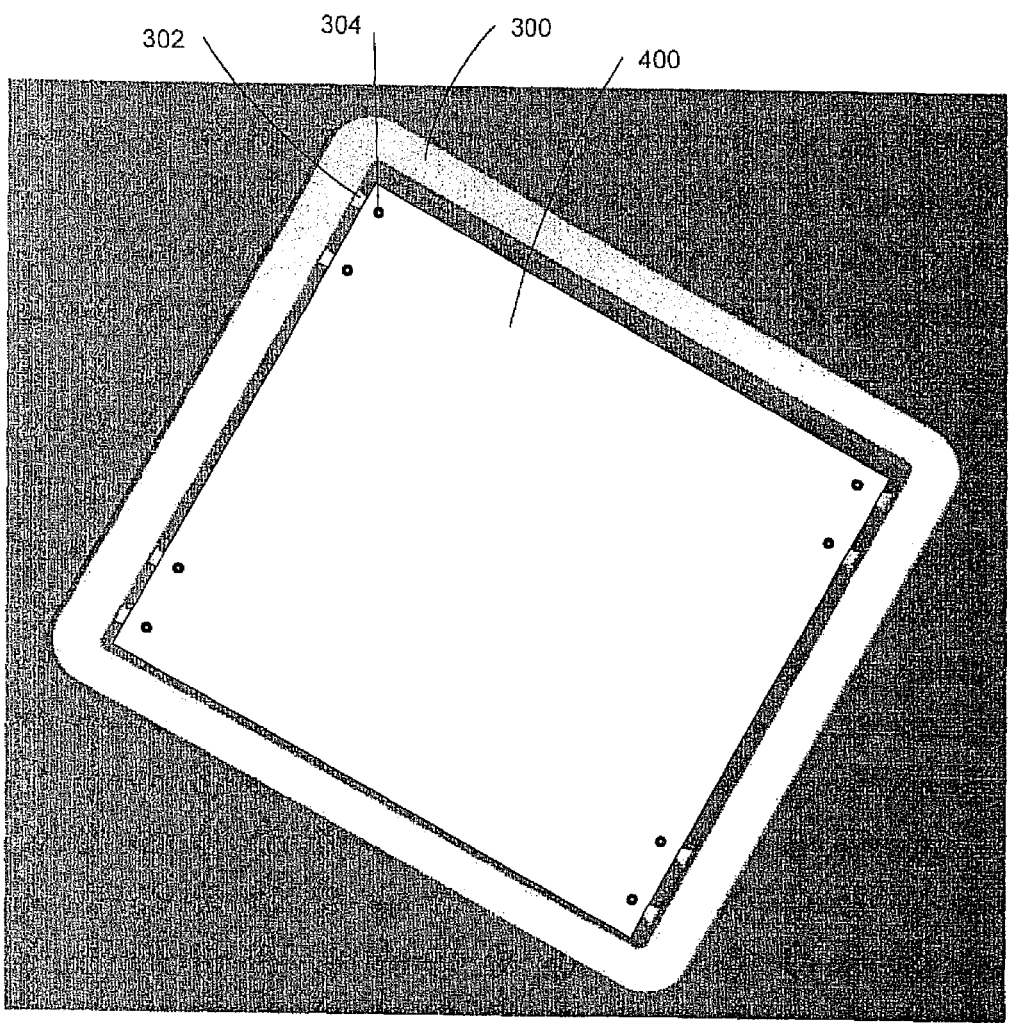
FIG. 4 illustrates a top-down view of the holding frame of FIG. 3 with a film attached to the micro-barbs in accordance with an embodiment of the present disclosure.

FIG. 4 illustrates the placement of a film 400 onto the barbs 304 of a frame 300. In one embodiment, an outer portion of the film 400 is a sacrificial material with an inner portion of the film 400 containing solar material (e.g., a gallium arsenide layer). The micro-barbs 304 may be of any configuration, with a preferred embodiment illustrated in FIG. 5. The microbarbs 304 are held onto the frame 300 with the use of barb support arms 302. In one embodiment it is not required that the film 400 be aligned to the tray 300. In such an embodiment, there is enough sacrificial space around the edges of the PET film 400 that a precise alignment is not necessary.

The film 400 held by the micro-barbs 304 can then run through processing equipment, particularly conveyor-style horizontal wet cleaning tools. The high temperature polymers forming the frame 300 can also be used to hold the film in bake ovens as well. Further, the frames 300 of this disclosure are compatible with automated loading and provide less shadowing for better drying and provide better film retention, as discussed below. A frame 300 with micro-barbs 304 according to embodiments of this disclose allow for rapid automated loading and unloading, minimize contact area between the film 400 and frame 300 for better drying, provide less chemical carryout, and are not as sensitive to misalignment between the film 400 and the frame 300, than in conventional methods and apparatus.

Figure 6:
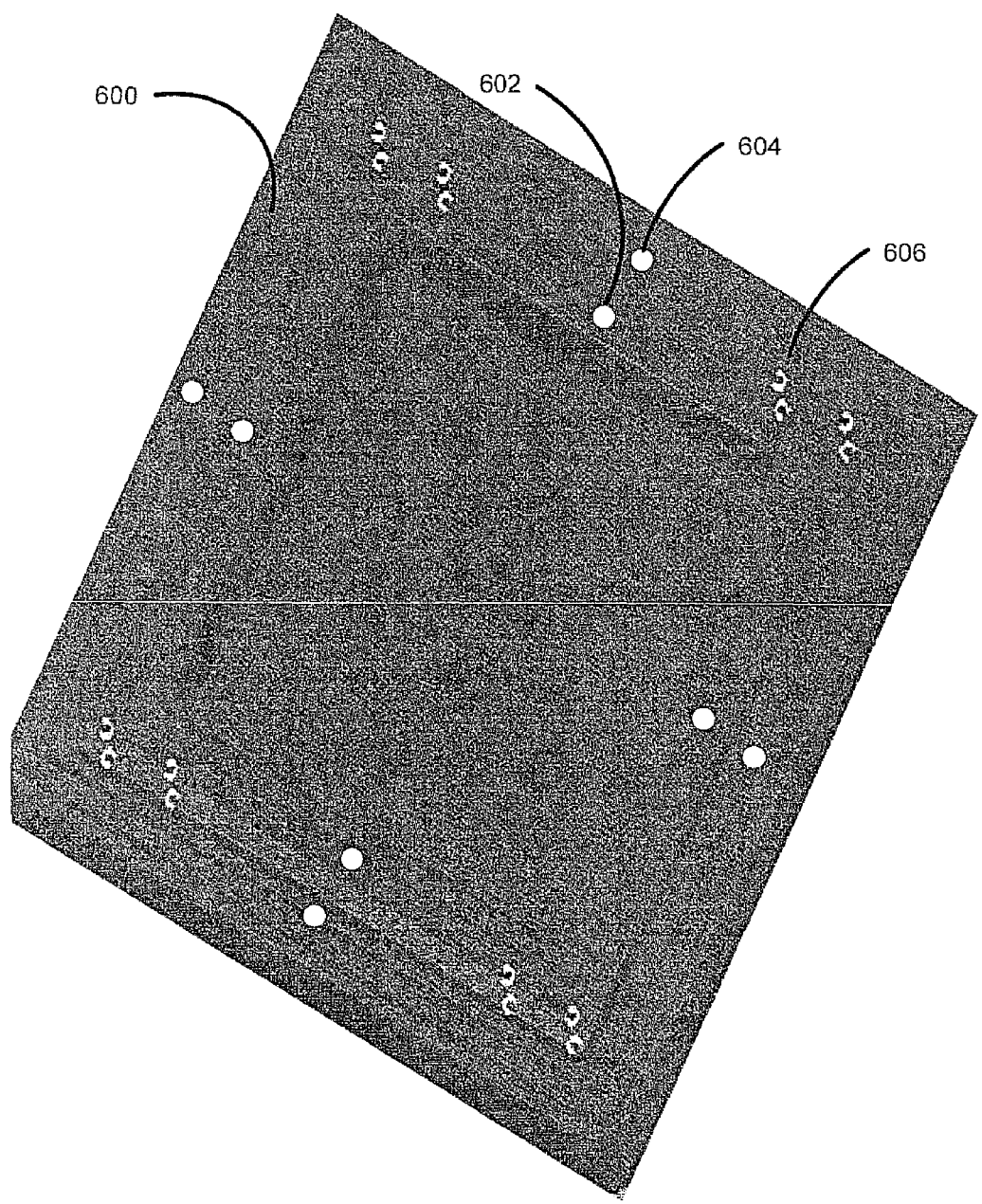
FIG. 6 illustrates a top-down view of an end-effecter with a plurality of vacuum line openings for holding the film and the holding frame in accordance with an embodiment of the present disclosure.

FIG. 6 illustrates the end-effecter 600 with vacuum line openings 602, 604 to provide a vacuum chuck for holding and moving the film 400 and/or frame 300. As illustrated in FIG. 6, the end-effecter 600 comprises an inner ring of vacuum line openings 602 that are positioned for holding onto the film 400, and an outer ring of vacuum line openings 604 for holding onto the frame 300. As discussed above, portions of the end-effecter 600 comprise circular cavities 606 that are located at each barb 304 location. As the end-effecter 600 is pushed down against the frame 300 and against the micro-barbs 304, the film 400 defects into the circular cavity 606 until the film 400 fails and the micro-barbs 304 push through it. The end effecter 600 pushes the film 400 into the undercut of the barbs 304, retaining the film 400.

Figure 7:
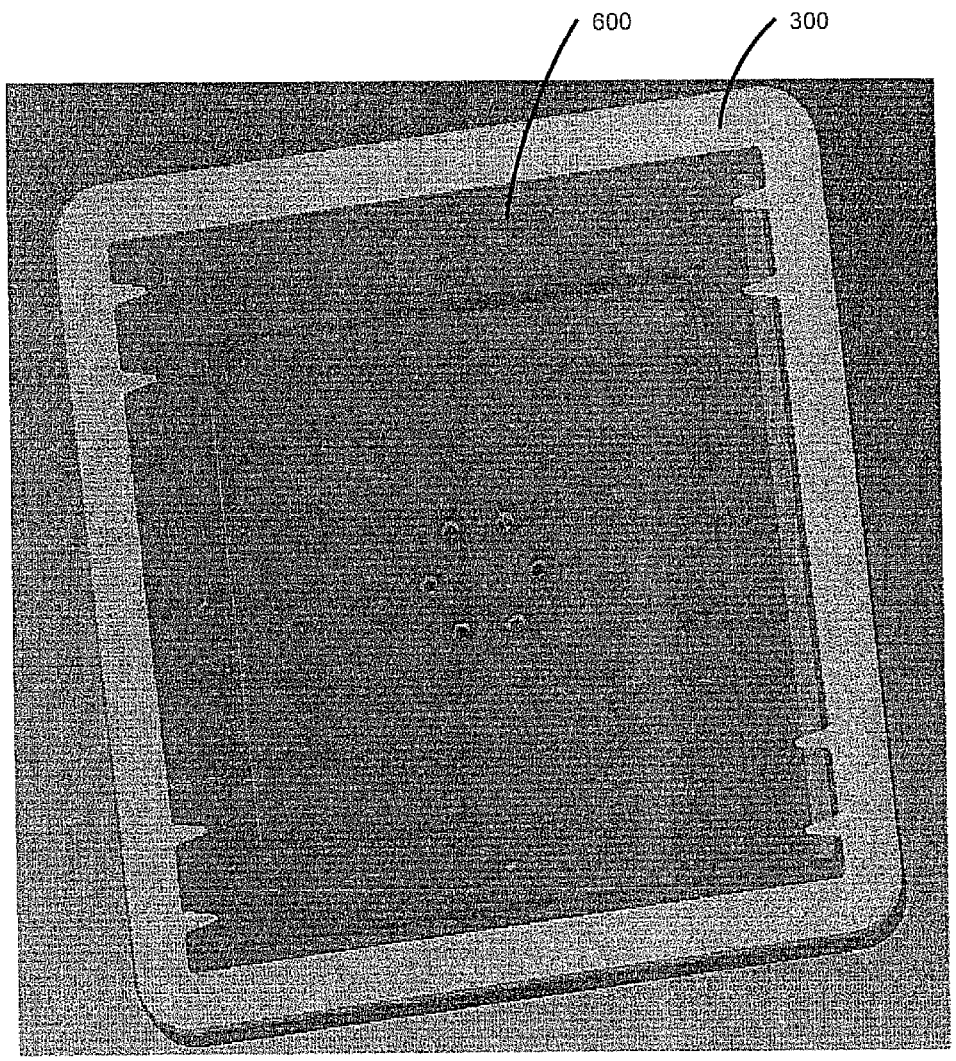
FIG. 7 illustrates a top-down view of a holding frame and end-effecter in accordance with an embodiment of the present disclosure.

As illustrated in FIG. 7, the outer ring of vacuum line openings 604 are used to hold onto the frame 300 (which are obscured by the frame 300 in FIG. 7). As shown in FIG. 7, the end-effecter 600 may also be used to move the frame 300 and film 400 assembly after the film 400 has attached to the micro-barbs 304 (film 400 not shown).

An exemplary process starts with a singulated film of PET 400 with the solar material (e.g., a gallium arsenide layer) in it. The PET film assembly 400 must be able to run through a cleaner, a bake oven and other process steps upstream. But the PET film 400 can't run through the cleaner or any of the other process tools by itself. It's too flimsy. It doesn't have enough rigidity. The PET film 400 needs to be loaded onto a frame 300, i.e., some mechanism to hold it.

In one embodiment, as described above, the PET film 400 is held by microbarbs 304 that are attached to the corners of the frame 300. A robot picks up the PET film by means of an end-effecter 600, with vacuum line openings 602, 604 to act as a vacuum chuck and presses the film 400 onto the frame 300 with the micro-barbs 304. The vacuum holds the film 400 tightly while the micro-barbs 304 are pressed into the PET film 400. In one embodiment, the PET film assembly 400 is a six inch square with an exemplary gallium arsenide solar material taking up a four inch square in the center of the six inch square. The outer inch portion is sacrificial.

Shadowing, which is the hiding of the film 400 from the dryer or rinsing must be avoided. Furthermore, the different chemicals from the different baths must not be allowed to be carried over from one bath to another. In one embodiment, the barbs 304 are sloped down to aid in preventing bath materials from being carried over on the micro-barb support arms 302. The downward slope of the arms 302 can also aid in cleaning the bath liquid off during rinsing. The gallium arsenide layer of an exemplary PET film 400 may be etched by carrying the chemicals from one bath to another. The PET film assembly 400 starts in a hydrofluoric acid bath, goes through a rinse, and then into a peroxide bath, followed by an ammonium hydroxide bath. Carrying hydrofluoric acid (HF) to the peroxide bath will etch the gallium arsenide layer, as will carrying the peroxide bath into the ammonium hydroxide bath.

Figure 8:
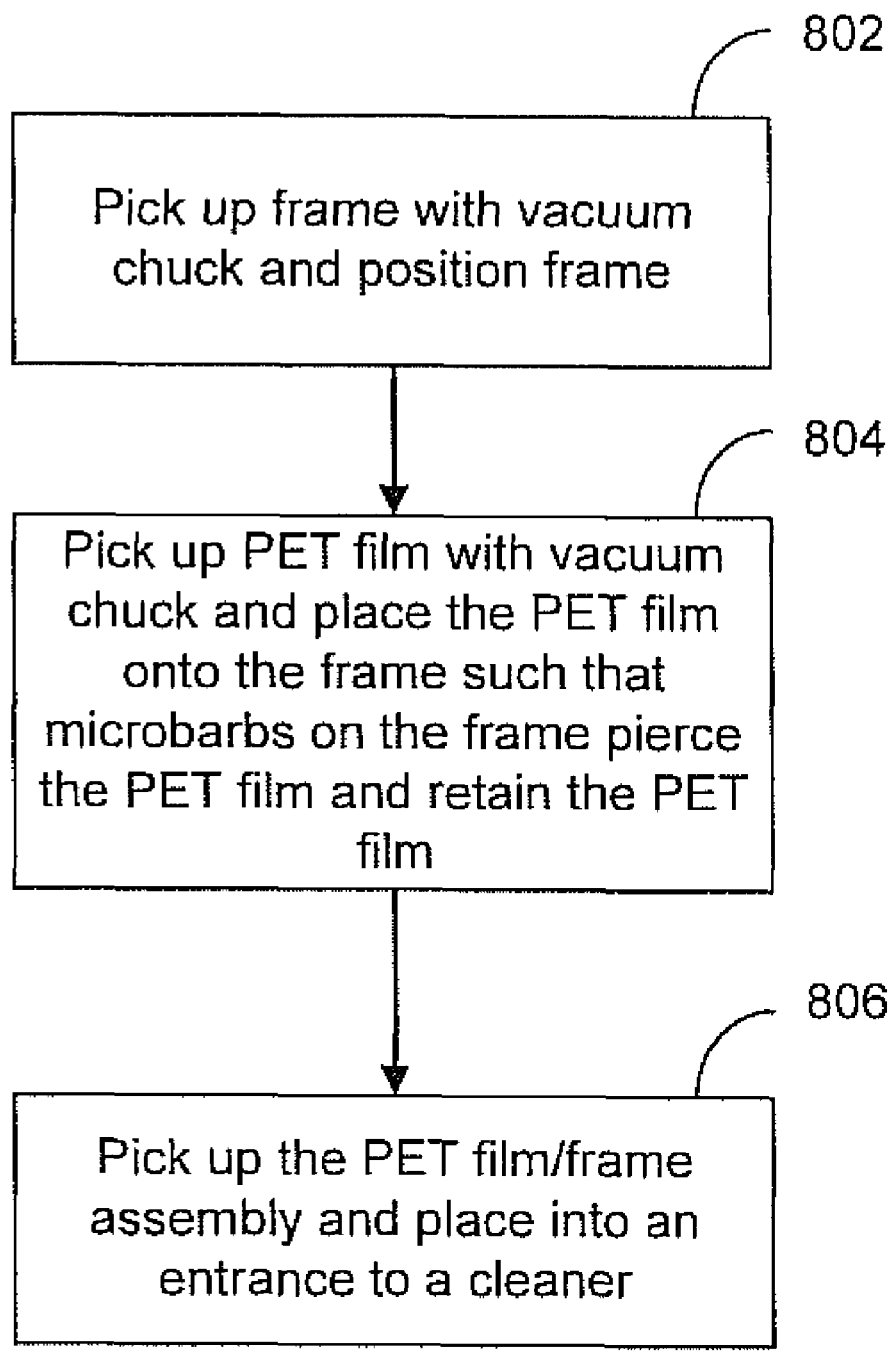
FIG. 8 illustrates a flow diagram, illustrating the steps to a method in accordance with an embodiment of the present disclosure.

FIG. 8 illustrates steps to an exemplary process for assembling a frame/film assembly using micro-barbs on the frame. In step 802, a robotic arm with an end-effecter 600 with vacuum chuck assembly 602, 604 picks up the frame 300, places it into a prescribed location. In step 804, the robotic arm with the end-effecter 600 with vacuum chuck assembly 602, 604 picks up a PET film assembly 400 and places the PET film 400 on the frame 300 (where the microbarbs 304 on the frame 300 pierce the film 400 and hold onto it). In step 806, the robotic arm with the end-effecter 600 with vacuum chuck assembly 602, 604 picks up the frame 300 and film 400 assembly and drops the frame/film assembly into an entrance to a cleaner.

In one embodiment, the frame 300 may be chemically compatible with a range of acids, bases, and oxidizers. The frame 300 should be able to withstand oven temperatures of up to 150 degrees Centigrade. The frames 300 should be compatible with automated equipment that moves the frames and loads, or unloads the films 400 at rates of up to 20 films per minute. The frame 300 should have a profile of 3.5 mm or less to be compatible with standard equipment. The frames 300 should be easily loaded into a cassette for off-tool transportation when carrying films 400 or a coinstack box for off-tool transportation without films 400. Various embodiments of the present disclosure may realize a frame 300 that is re-usable for approximately 5000 cycles when formed of PEEK, while a frame 300 formed of PVDF may be re-usable for approximately 2000 cycles. Such requirements are met by the above described embodiments with a frame comprising a plurality of microbarbs on barb support arms that retain the film without requiring a second piece to secure the film or without requiring the presence of pre-existing features in the film.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:
1. A single piece apparatus for retaining a film comprising:
 a frame having a shape with a center open area larger than the film;
 a plurality of fingers on the frame extending into the open area; and
 a barb positioned on an end of each of the plurality of fingers, wherein the barbs retain the film.
2. The single piece apparatus of claim 1, wherein the barbs retain the film by piercing the film.
3. The single piece apparatus of claim 1, wherein the fingers have a downward slope.
4. The single piece apparatus of claim 1, wherein the single piece apparatus for retaining the film is no more than 3.5 mm thick.
5. The single piece apparatus of claim 1, wherein the barb comprises an undercut.
6. The single piece apparatus of claim 1, wherein the frame has a rectangular shape, and wherein at least one of the plurality of fingers is located in each corner of the frame.
7. The single piece apparatus of claim 1, wherein the frame is formed of a high temperature polymer.
8. The single piece apparatus of claim 7, wherein the high temperature polymer comprises polyether ether ketone or polyvinylidene fluoride.
9. The single piece apparatus of claim 1, wherein the film comprises a singulated film of polyester with a gallium arsenide layer on it.

10. A system for retaining a film on a single-piece frame comprising:
   a frame having a shape with a center open area larger than the film, the frame comprising
      a plurality of fingers on the frame extending into the open area; and
      a barb positioned on an end of each of the plurality of fingers, wherein the barbs retain the film; and
   an end effecter comprising a first and second plurality of vacuum line openings, wherein the end effecter holds onto the film with the first plurality of vacuum line openings and holds onto the frame with the second plurality of vacuum line openings, wherein the end effecter picks up the film with the first plurality of vacuum line openings and presses the film onto the frame, wherein pressing the film onto the frame will retain the film on the barbs.

11. The system of claim 10, wherein the end effecter picks up the frame with the retained film with the second plurality of vacuum line openings and positions the frame/film assembly for processing.

12. The system of claim 10, wherein the end effecter picks up the frame with the second plurality of vacuum line openings and prepositions the frame before picking up the film with the first plurality of vacuum line openings to press the film onto the frame.

13. The single piece apparatus of claim 10, wherein the barbs retain the film by piercing the film.

14. The single piece apparatus of claim 13, wherein the end effecter comprises circular cavities corresponding to each barb location, such that as the end effecter pushes down against the frame and against the barbs, the film deflects into the circular cavity until the film fails and the barb pushes through.

15. The single piece apparatus of claim 10, wherein the fingers have a downward slope.

16. The single piece apparatus of claim 10, wherein the single piece apparatus for retaining the film is no more than 3.5 mm thick.

17. The single piece apparatus of claim 10, wherein the barb comprises an undercut.

18. The single piece apparatus of claim 10, wherein the frame has a rectangular shape, and wherein at least one of the plurality of fingers is located in each corner of the frame.

19. The single piece apparatus of claim 10, wherein the frame is formed of a high temperature polymer.

20. The single piece apparatus of claim 19, wherein the high temperature polymer comprises polyether ether ketone or polyvinylidene fluoride.

21. The single piece apparatus of claim 10, wherein the film comprises a singulated film of polyester with a gallium arsenide layer on it.

22. A method for retaining a film on a single-piece frame comprising:
   picking up the film with an end-effecter, wherein the end-effecter picks up the film with a first plurality of vacuum line openings;
   moving the film with the end-effecter to a single-piece frame and pressing the film onto the frame to retain the film, wherein the frame comprises a shape with a center open area larger than the film, the frame comprising:
      a plurality of fingers on the frame extending into the open area; and
      a barb positioned on an end of each of the plurality of fingers, wherein the barbs retain the film by piercing the film.

23. The method of claim 22, wherein the frame has a rectangular shape, and wherein at least one of the plurality of fingers is located in each corner of the frame.

24. The method of claim 22, wherein the end effecter comprises circular cavities corresponding to each barb location, such that as the end effecter pushes down against the frame and against the barbs, the film deflects into the circular cavity until the film fails and the barb pushes through.

* * * * *